United States Patent [19]
Niina et al.

[11] Patent Number: 5,187,547
[45] Date of Patent: Feb. 16, 1993

[54] LIGHT EMITTING DIODE DEVICE AND METHOD FOR PRODUCING SAME

[75] Inventors: Tatsuhiko Niina; Kiyoshi Ohta; Toshitake Nakata; Yasuhiko Matsushita; Takahiro Uetani; Yoshiharu Fujikawa, all of Osaka, Japan

[73] Assignee: Sanyo Electric Co., Ltd., Osaka, Japan

[21] Appl. No.: 616,768

[22] Filed: Nov. 19, 1990

Related U.S. Application Data

[63] Continuation of Ser. No. 347,444, May 4, 1989, abandoned.

[30] Foreign Application Priority Data

| May 18, 1988 | [JP] | Japan | 63-121052 |
| Jan. 25, 1989 | [JP] | Japan | 63-15711 |
| Feb. 14, 1989 | [JP] | Japan | 1-34282 |
| Mar. 3, 1989 | [JP] | Japan | 1-52302 |

[51] Int. Cl.$^5$ .............. H01L 33/00; H01L 29/161; H01L 29/20; H01L 23/02
[52] U.S. Cl. .............. 257/77; 257/98; 257/99; 257/103
[58] Field of Search .......... 357/17, 60, 56, 61, 357/74; 437/905, 906; 148/DIG. 148

[56] References Cited

U.S. PATENT DOCUMENTS

| 3,530,324 | 9/1970 | Koller et al. | 357/17 |
| 3,864,720 | 2/1975 | Merrin | 357/17 |
| 3,964,157 | 6/1976 | Kahn et al. | 29/591 |
| 3,972,749 | 8/1976 | Pavlichenko | 148/33 |
| 3,986,193 | 10/1976 | Vodakov et al. | 357/17 |
| 4,531,142 | 7/1985 | Weyrich et al. | 357/17 |
| 4,912,064 | 3/1990 | Kong et al. | 437/100 |
| 4,918,497 | 4/1990 | Edmond | 357/17 |
| 5,011,549 | 4/1991 | Kong et al. | 148/33.1 |

FOREIGN PATENT DOCUMENTS

| 59-4088 | 1/1984 | Japan | 357/17 |
| 60-143674 | 7/1985 | Japan | 357/17 |
| 60-261181 | 12/1985 | Japan | 357/17 |

OTHER PUBLICATIONS

"Single Crystal Growth of SiC Substrate Material for Blue LED," by Ziegler et al. IEEE Trans. Mar. 1983 pp. 277–281.
G. Gramberg & M. Koniger "Preparation & Properties of Vapor Phase Epitaxial SiC Diodes" Jun. 11, 1971; Solid State Electronics vol. 15, 1972 pp. 285–292.
S. M. Sze "Semiconductor Devices Physics & Technology" ©1985 pp. 6–7.
J. Appl. Phys., vol. 60, 1986, pp. 2842–2853.
Appl. Phys. Letter, vol. 49, 1986, pp. 1074–1449.
Kuroda et al., Extended Abstr. 19th Conf. Solid State Devices and Materials, Tokyo, 1987, pp. 227–230.
Shibahara et al., Jpn. J. Appl. Phys., vol. 26, 1987, pp. L1815–L1817.

*Primary Examiner*—Jerome Jackson, Sr.
*Assistant Examiner*—D. Monin
*Attorney, Agent, or Firm*—Darby & Darby

[57] ABSTRACT

A light emitting diode device comprises an n type silicon carbide substrate having first and second major surfaces opposite to each other at least inclined at a predetermined angle not less than 3° from a {0001} plane, an n type silicon carbide layer grown on the first major surface, a p type silicon carbide layer grown on the n type silicon carbide layer, a p type ohmic electrode formed on a partial area of the p type silicon carbide layer, and an n type ohmic electrode formed on a partial area of the second major surface. The diode element has a substantially trapezoidal form in a cross section orthogonal to the first major surface. The diode element has the side of the p type silicon carbide layer broader than the side of the second major surface and is supported at the side of the type silicon carbide layer fixed to a supporting stem.

34 Claims, 4 Drawing Sheets

LIGHT EMITTING DIODE DEVICE AND METHOD FOR PRODUCING SAME

This is a continuation of application Ser. No. 347,444, filed May 4, 1989 now abandoned.

FIELD OF THE INVENTION

This invention relates to a light emitting diode device and a method for producing the same. More particularly, it relates to a silicon carbide light emitting diode device capable of emitting blue light and a method for producing the same.

DESCRIPTION OF THE PRIOR ART

Silicon carbide SiC is attracting attention as the semiconductor material capable of withstanding various environmental conditions because of its physical and chemical properties such as high thermal resistance, mechanical strength and invulnerability to radiations. In addition, the SiC crystals present various crystal structures, such as cubic and hexagonal ones, for the same chemical composition, have a energy band gap of 2.39 to 3.33 eV and are capable of forming pn junction. Therefore, SiC is hopeful as a diode material emitting visible light in the wavelength range of red to blue. Particularly, the 6H type SiC crystal having an energy band gap of about 3 eV at room temperature is employed as a material for the light emitting diode for emitting blue light.

The growth of the SiC monocrystal is performed by a dipping method, which is a kind of liquid phase epitaxial growth method, using a device shown in a cross section in FIG. 4. In FIG. 4, a crucible 16 is heated in an inert gas atmosphere by a high frequency induction heating coil (not shown) provided on the outer side of the crucible 16 to melt Si material 17. A 6H type SiC monocrystal base plate or substrate 20 is attached and secured in a V-shaped recess 19 formed at the lower end of a supporting graphite rod 18. The substrate 20 together with the supporting rod 18 is dripped for a predetermined time in the Si melt 17, so that the 6H type SiC monocrystal is grown on the surface of the substrate 20.

In the above described growth process of the SiC monocrystal, a small amount of carbon C is dissolved into the Si melt 17 from the heated crucible 16, conveyed to the vicinity of the substrate 20 by the convection of the Si melt 17, and reacted with Si.

During the growth of the crystal, the supporting rod 18 is rotated as shown by an arrow mark in FIG. 4, so that the substrate 20 is rotated at a fixed position to form the homogenous grown layer.

It is noted that, for growth of an n type layer, silicon nitride $Si_3N_4$ is added as donor impurities to the Si melt 17, at the same time that a minor quantity of aluminum Al is added. The doped N and Al impurities act as donor-acceptor pairs for light emission. For growth of a p type layer, there is added Al as acceptor impurities.

A conventional SiC light emitting diode is formed by sequentially stacking an n type layer and a p type layer having their respective controlled impurity concentrations on a major surface of an n type SiC substrate and forming an Al/Si electrode on the surface of the p type layer and an Au/Ni electrode on the other major surface of the n type substrate.

However, the SiC as the light emitting material has an indirect interband transition type energy band structure, so that it has a low light emitting efficiency as compared with a direct interband transition type light emitting material. Consequently, the conventional SiC light emitting diode has an intensity of light emission lower than that of the light emitting diode formed of other materials, for example, GaP and GaAlAs.

SUMMARY OF THE INVENTION

It is therefore an object of the present invention to provide a SiC light emitting diode device capable of emitting light of high luminosity and a method for producing the same.

In an aspect of the present invention, a light emitting diode device comprises a light emitting diode element and a stem supporting the diode element, the diode element including: an n type silicon carbide substrate having first and second major surfaces opposite to each other, at least the first major surface being inclined at a predetermined angle from a {0001} plane; an n type silicon carbide layer grown on the first major surface; a p type silicon carbide layer grown on the n type silicon carbide layer; a first ohmic electrode formed on at least a portion of the p type silicon carbide layer; and a second ohmic electrode formed on at least a portion of the second major surface, the diode element having a substantially trapezoidal form in a cross section orthogonal to the first major surface, with the p type silicon carbide layer side being broader than the second major surface, the diode element being fixed to the stem at the p type silicon carbide layer side.

In another aspect of the present invention, a method for producing a light emitting diode device comprises the steps of: providing in a graphite crucible a silicon melt containing aluminum for affording positive carriers of $5.5 \times 10^{16}$ to $6 \times 10^{17}$ cm$^{-3}$ and nitrogen for affording negative carriers of $7 \times 10^{17}$ to $5 \times 10^{18}$ cm$^{-3}$, dipping in the silicon melt an n type silicon carbide substrate having first and second major surfaces opposite to each other, at least the first major surface being inclined at a predetermined angle from an {0001} plane to form an n type silicon carbide layer by epitaxial growth on the first major surface at a temperature in the range of 1650° to 1800° C.; forming a p type silicon carbide layer by epitaxial growth on the n type silicon carbide layer; forming a first ohmic electrode on the p type silicon carbide layer; and forming a second ohmic electrode on the second major surface.

In a further aspect of the present invention, a light emitting diode element comprises an n type silicon carbide substrate having first and second major surfaces opposite to each other, at least the first major surface being inclined at a predetermined angle not less than 3° from a {0001} plane; an n type silicon carbide layer grown on the first major surface; a p type silicon layer grown on the n type silicon carbide layer; a first ohmic electrode formed on at least a portion of the p type silicon,, carbide layer; and a second ohmic electrode formed on to at least a portion of the second major surface.

In a further aspect of the present invention, a method for producing a light emitting diode device comprises the steps of: providing an n type silicon carbide substrate having first and second major surfaces opposite to each other, at least the first major surface being inclined at a predetermined angle from a {0001} plane; forming an n type silicon carbide layer by liquid phase epitaxial growth on the first major surface; forming a p type silicon layer by epitaxial growth on the n type silicon carbide layer; forming a first ohmic electrode on at least a portion of the p type silicon carbide layer; forming a second ohmic electrode on at least a portion of the second major surface to produce a light emitting diode element; shaping the diode element so that it has a substantially trapezoidal form in a cross section orthogonal to the first major surface, with the p type silicon carbide side being broader than the second major surface side; and fixing the p type silicon layer side to a supporting stem.

In a further aspect of the present invention, a method for producing a light emitting diode element comprises the steps of: providing an n type silicon carbide substrate having first and second major surfaces opposite to each other, at least the first major surface being inclined at a predetermined angle not less than 3° from a {0001} plane; forming an n type silicon carbide layer by liquid phase epitaxial growth on the first major surface; forming a p type silicon carbide layer by epitaxial growth on the n type silicon carbide layer; forming a first ohmic electrode on at least a portion of the p type silicon carbide layer, and forming an second ohmic electrode on at least a portion of the second major surface.

The foregoing and other objects, features, aspects and advantages of the present invention will become more apparent from the following detailed description of the present invention when taken in conjunction with the accompanying drawings.

DESCRIPTION OF PREFERRED EMBODIMENTS

Figure 1:
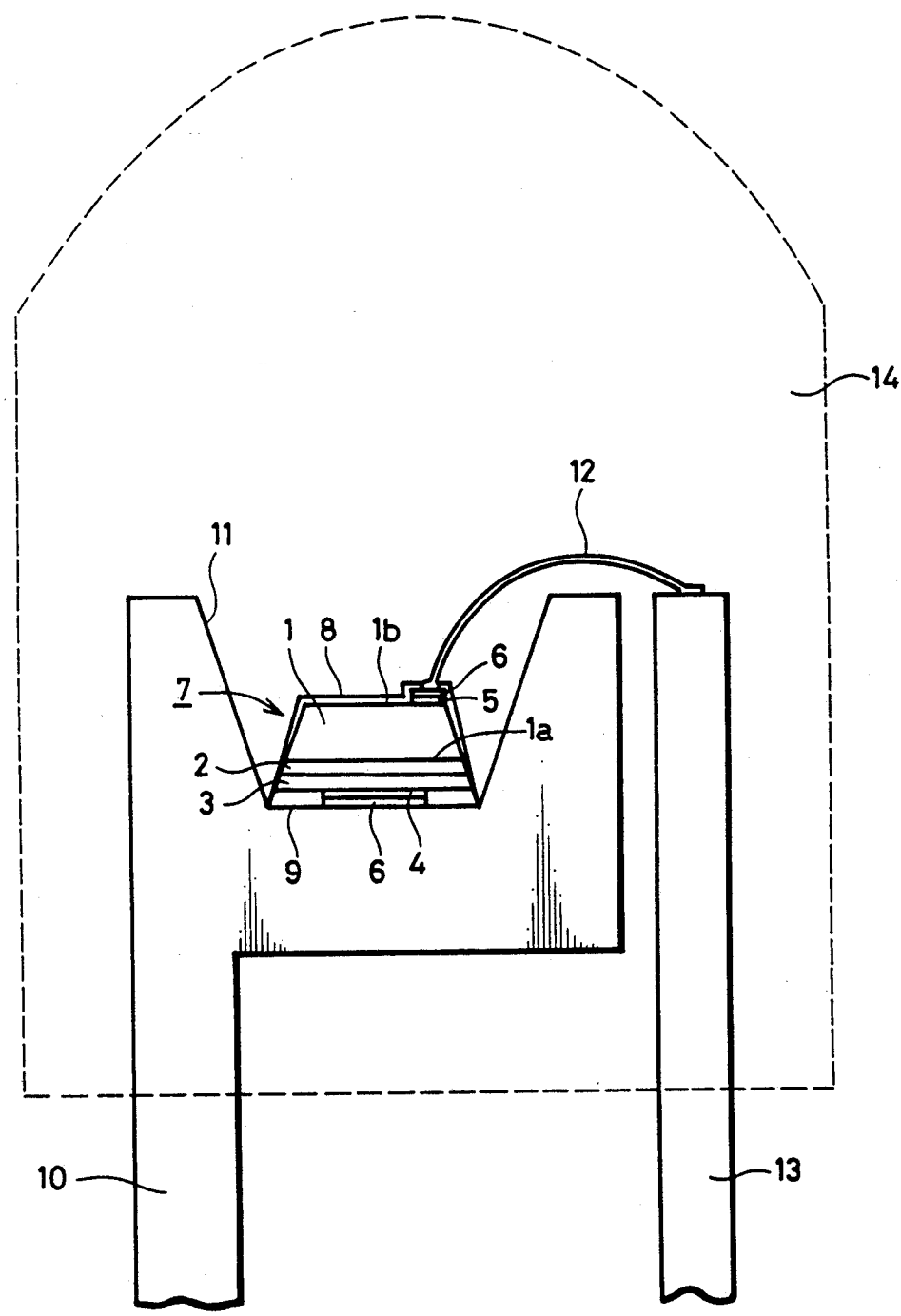
FIG. 1 is a sectional view showing a light emitting diode device according to an embodiment of the present invention.

Referring to FIG. 1, a light emitting diode element 7 includes a substrate 1 of a second silicon carbide SiC, an n type SiC layer 2 and a p type SiC layer 3 formed in this order by epitaxial growth on a first major surface 1a of the substrate 1.

The light emitting diode element 7 has a thickness of 50 to 100 μm and a substantially trapezoidal form in a cross section perpendicular to the first major surface 1a. The bottom surface of the p type SiC layer 3 has an area of about 300×300 μm². A second major surface 1b of the n type SiC substrate 1 opposite to the first major surface 1a has an area of about 260×260 μm².

The substrate 1 has a thickness of 30 to 80 μm, an n type carrier concentration of not less than about $1 \times 10^{17}$ cm$^{-3}$ and a specific resistance of not higher than 1.0 Ωcm. The substrate 1 has the first major surface 1a and the second major surface 1b opposite to the first major surface 1a. The first major surface 1a is inclined at a predetermined angle toward a <11$\bar{2}$0> or <10$\bar{1}$0> direction from a (000$\bar{1}$) plane on which a C atomic plane appears or a (0001) plane on which a Si atomic plane appears.

The above off-angle of the first major surface 1a from a {0001} plane is usually 1° to 10° preferably 3° to 10° and more preferably 3° to 7°. In the present embodiment, the off-angle is 5°.

Figure 3:
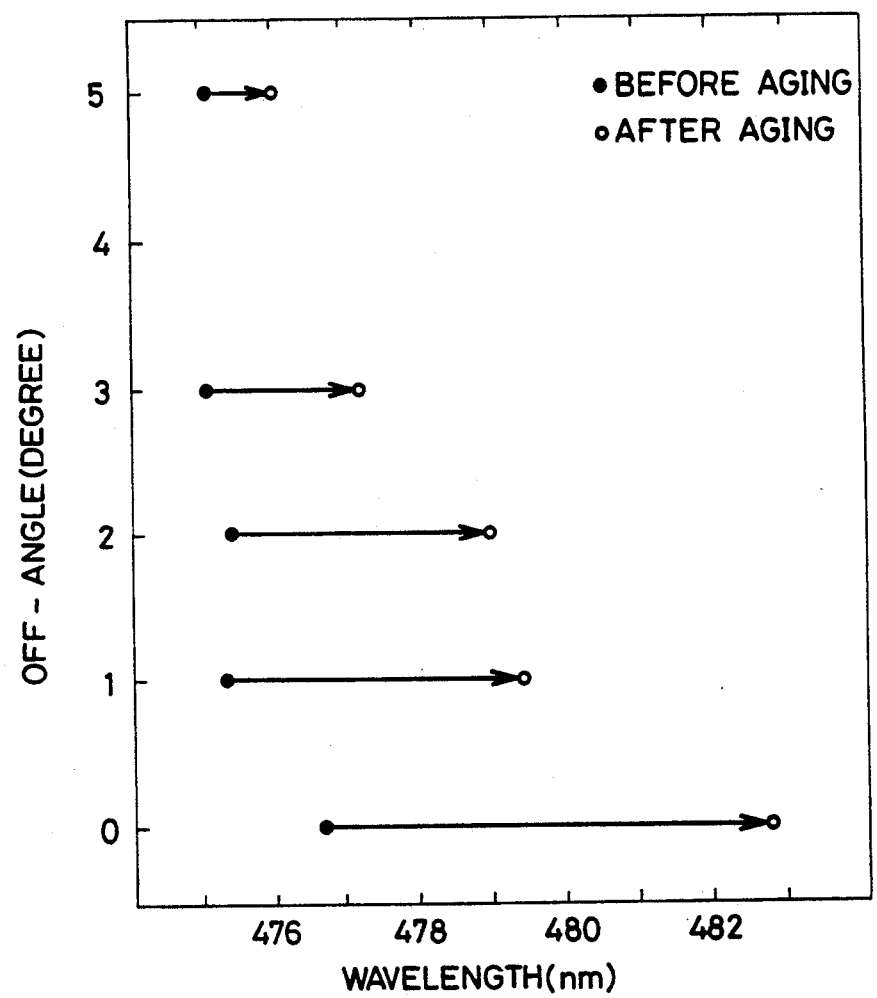
FIG. 3 is a diagram showing the wavelength of the emitted light before and after aging under electric current.

FIG. 3 shows the relation between the off-angle of the first major surface 1a of the substrate 1 from the (000$\bar{1}$) plane and the wavelength of emitted light, before and after aging under electric current, of the light emitting diode element 7 produced using the substrate 1.

The aging under electric current was performed at a current of 40 mA for 50 hours. Although the light emitted from the SiC diode includes a plurality of peak wavelengths, a point in FIG. 3 indicates the representative wavelength corresponding to one color felt by human eyes with the light emitted from the SiC diode. It is seen from this figure that, for the off-angle of 0°, the wavelength of the emitted light before aging under electrical current is longer and the shift of the wavelength of the emitted light after the aging is larger, as compared with those in the case of providing an off-angle to the first major plane 1a. These characteristics of the diode are ascribable to the presence of a number of crystal defects in the grown layers on the substrate 1. It is also seen from the decreased shift of the wavelength of the emitted light caused by the aging with the increased off-angle of the first major surface 1a that the crystal defects in the grown layers on the substrate 1 are decreased and crystal integrity of the grown layers is improved. The data for the off-angle of not less than 5° is not shown in the drawing, since it was found to be about equal to that for the off-angle of 5°.

In this manner, selection of the off-angle is highly effective for improving the crystal integrity of the n type SiC layer 2 formed by epitaxial growth and for preventing the wavelength of the emitted light of the light emitting diode element 7 from becoming longer.

In the meantime, the surface of the grown layer on the substrate surface 1a inclined from the (0001) plane tends to become roughened in the form of waves as compared with the surface of the layer grown on the substrate surface 1a inclined from the (000$\bar{1}$) plane. On the other hand, the shifting of the wavelength of the emitted light by the aging of the light emitting diode element prepared using the substrate surface 1a inclined from the (000$\bar{1}$) plane becomes smaller than that of the device produced using the substrate surface inclined from the (0001) plane. Therefore, it is more preferred to use the substrate surface 1a inclined from the (000$\bar{1}$) plane, rather than that inclined from the (0001) plane.

The n type SiC layer 2 has a thickness of 5 to 10 μm and the n type carrier concentration of $1 \times 10^{17}$ to $5 \times 10^{18}$ cm$^{-3}$, preferably $2 \times 10^{17}$ to $3 \times 10^{18}$ cm$^{-3}$ and more preferably $5 \times 10^{17}$ to $1 \times 10^{18}$ cm$^{-3}$. It should be noticed herein that the n type carrier concentration of the n type SiC layer 2 is calculated by subtracting positive carrier (hole) concentration due to added Al from negative carrier (electron) concentration due to added N. Therefore various combinations of amounts of N and Al to be added can be selected for obtaining a certain n type carrier concentration of the n type SiC layer 2. Table 1 below shows several examples of these combinations.

TABLE I

| carrier concentration of n-type SiC layer (cm$^{-3}$) | concentration of negative carriers by N (cm$^{-3}$) | concentration of positive carriers by Al (cm$^{-3}$) |
|---|---|---|
| $1 \times 10^{17} \sim 5 \times 10^{18}$ | $7 \times 10^{17} \sim 5 \times 10^{18}$ | $5.5 \times 10^{16} \sim 6 \times 10^{17}$ |

TABLE I-continued

| carrier concentration of n-type SiC layer (cm$^{-3}$) | concentration of negative carriers by N (cm$^{-3}$) | concentration of positive carriers by Al (cm$^{-3}$) |
|---|---|---|
| $2 \times 10^{17} \sim 3 \times 10^{18}$ | $7 \times 10^{17} \sim 3 \times 10^{18}$ | $5.5 \times 10^{16} \sim 5 \times 10^{17}$ |
| $5 \times 10^{17} \sim 1 \times 10^{18}$ | $7.2 \times 10^{17} \sim 1.0 \times 10^{18}$ | $5.5 \times 10^{16} \sim 2.6 \times 10^{17}$ |

In the present embodiment, as described hereinabove, the crystal integrity of the n type SiC layer 2 may be improved by using the substrate surface 1a which is inclined from the (000$\bar{1}$) plane or from the (0001) plane. Therefore, more impurities may be added than heretofore without impairing the crystal integrity of the n type SiC layer. The increased impurities result in the increased number of donor-acceptor pairs acting as centers of light emission and thus the increased intensity of the emitted light.

The p type SiC layer 3 has a thickness of 5 to 10 μm and the p type carrier concentration of $1 \times 10^{17}$ to $5 \times 10^{18}$ cm$^{-3}$, and preferably $2 \times 10^{17}$ to $3 \times 10^{17}$ cm$^{-3}$.

A first ohmic electrode 4 is located on at least a portion at the center of the surface of the p type SiC layer 3. It is formed of Ti, Al and Ti films stacked in this order on the p type SiC layer 3 and has a surface area of $7 \times 10^{-5}$ to $7 \times 10^{-4}$ cm$^2$. This electrode surface area of the first ohmic electrode 4 is effective to emit high-quality blue light not mixed with green light with a usual current intensity in the range of 5 to 50 mA, though it is known that the wavelength of the emitted light is changed by current density at the light emitting portion of the n type SiC layer 2. In the present embodiment, the p type SiC layer 3 having the carrier concentration of $1 \times 10^{17}$ to $5 \times 10^{18}$ cm$^{-3}$ has a high specific resistance, so that the current path does substantially not expand in the p type SiC layer 3. Further, the n type SiC layer 2 and the first ohmic electrode 4 are spaced apart by only a small distance from each other. Therefore, the density of the electrical current flowing in the light emitting portion of the n type SiC layer 2 is not related with the size of the p type SiC layer 3, but is governed by the current intensity (that is injected current) in the p type SiC layer 3 and by the surface area of the first ohmic electrode 4. Our experiments for various values of the injected current and the electrode surface area have revealed that high quality blue light not mixed with green light can be obtained with the electrode surface area of not more than $7 \times 10^{-4}$ cm$^2$, at a current in the range of 5 to 50 mA. However, with the electrode surface area of less than $7 \times 10^{-5}$ cm$^2$, current concentration is enhanced and the diode element is deteriorated severely, so that the operational reliability of the diode element is lowered. Therefore, the electrode surface area of the first ohmic electrode 4 of $7 \times 10^{-5}$ to $7 \times 10^{-4}$ cm$^2$ is most preferred.

The second ohmic electrode 5 is disposed off the center and on a portion of the second major surface 1b of the n type SiC substrate 1. It is formed of Ni and Pd films stacked in this order on the second major surface 1b.

Two bonding electrodes 6 are formed on the first ohmic electrode 4 and the second ohmic electrode 5, respectively. Each of these electrodes 6 is formed of a Ti, Pd and Au films stacked in this order on the corresponding ohmic electrode 4 or 5.

A protective film 8 made of Al$_2$O$_3$ or SiO$_2$ is deposited on the top surface and the lateral sides of the light emitting diode element 7. A first stem 10 has a reflective portion 11 surrounding the light emitting diode element 7. The light emitting diode element 7 is fixed to the first stem 10 on the side of the p type SiC layer 3 by silver paste 9.

The above described disposition of the diode element 7 has been selected for the following reasons. Since the light emitting region of the n type SiC layer 2 is aligned with the first ohmic electrode 4, when the affixture of the diode element 7 is made with the p type SiC layer 3 directing upward, the light directing upward is blocked by the first ohmic electrode 4 and cannot be taken out from upper side of the diode element 7. On the other hand, the n type SiC substrate 1 has light transmissivity higher than that of the p type SiC layer 3. In addition, the current can flow easily through the substrate 1 having the specific, resistance of as low as 1 Ωcm, so that the second ohmic electrode 5 can be located at a corner of the second major surface 1b of the substrate 1 in order to avoid obstructing the light emission. In addition, the light emitting diode element 7 has the trapezoidal form in a vertical section and has a broader bottom surface, so that the light emitted at the n type SiC layer 2 and directed towards the lateral side of the element 7 via the n type SiC substrate 1 has a larger incident angle with respect to the lateral sides of the element 7. As a result, the internal light reflection is decreased and the light may be taken out efficiently from the element 7.

A second stem 13 is electrically connected with the bonding electrode 6 formed on the second ohmic electrode 5 via a gold wire 12. A transparent epoxy resin type molding 14 overlies and covers the light emitting diode element 7 and portions of the first and second stems 10 and 13.

A typical method of producing the present device is hereinafter explained by referring to FIGS. 2A to 2G.

Figure 2A:
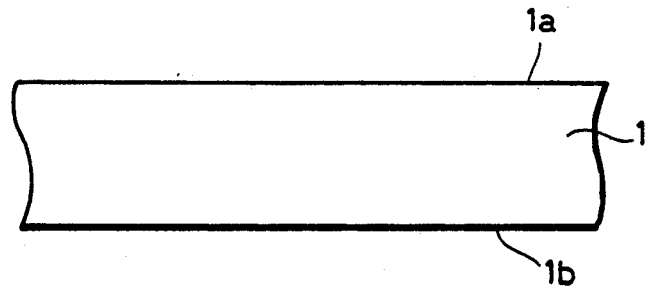
FIGS. 2A to 2G are sectional views illustrating a method of producing a light emitting diode device of the present invention.

Referring to first FIG. 2A, there is provided an n type SiC substrate 1 of a thickness of 350 to 500 μm having major surfaces of a (000$\bar{1}$) plane and a (0001) plane. The (000$\bar{1}$) or (0001) plane of this SiC substrate 1 is ground to be inclined by 1° to 10° toward the direction of <11$\bar{2}$0> or <10$\bar{1}$0>. Then, for removing the layer possibly damaged by the grinding, the inclined surface is etched in melted KOH at 400° to 500° C. or in an H$_2$ atmosphere of 1500° to 1800° C. The inclined surface thus produced is the aforementioned first major surface 1a of the substrate 1.

Figure 2B:
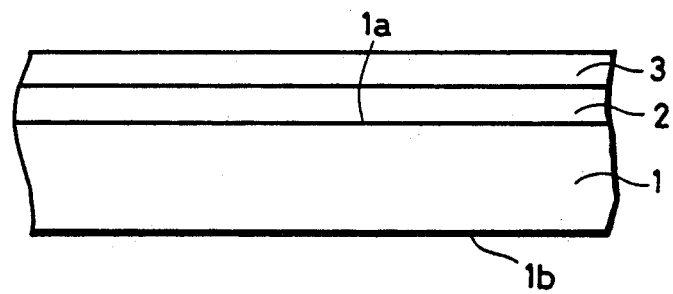
Figure 4:
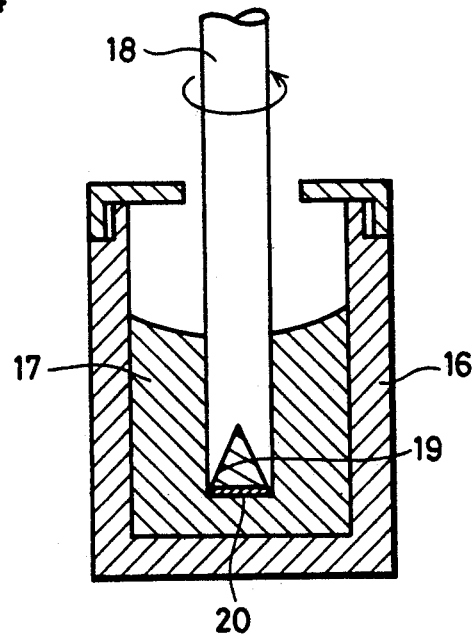
FIG. 4 is a sectional view showing a device for a crystal growth employed for producing a device of the present invention.

Referring to FIG. 2B, the n type SiC layer 2 and the p type SiC layer 3 are formed in this order on the first major surface 1a by liquid phase epitaxial growth at a temperature of 1500° to 1800° C. and preferably 1650° to 1800° C., for example, 1700° C., using the device of FIG. 4. At this time, the amount of impurities added to the Si melt 17 at the time of growth of the n type SiC layer 2 or the p type SiC layer 3 is determined for realizing the above described carrier concentration. For example, for producing the carrier concentration of the n type SiC layer 2 of $1 \times 10^{17}$ to $5 \times 10^{18}$ cm$^{-3}$, Si$_3$N$_4$ is added in an amount of $1.3 \times 10^{-3}$ to $3.0 \times 10^{-2}$ wt % and Al is added in an amount of 0.2 to 12.0 at %. For obtaining the carrier concentration of the p type SiC layer 3 of $1 \times 10^{17}$ to $5 \times 10^{18}$ cm$^{-3}$, Al is added in an amount of 0.45 to 20.0 at %.

After the growth of each layer, a second major surface of the n type SiC substrate is ground so that the total thickness of the laminated substrate may become 50 to 100 μm.

Figure 2C:
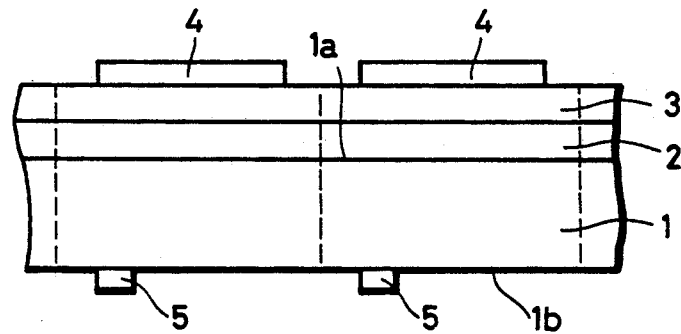

Referring to FIG. 2C, a Ti film of a thickness of not less than 300 Å, for example, 500 Å, an Al film of a film thickness of 5000 Å and a Ti film of a film thickness of 4000 Å are formed in this order on the p type SiC layer 3 by vacuum evaporation to form the first ohmic electrode 4. A Ni film of thickness of 3000 Å and a Pd film of thickness of 5000 Å are formed in this order on the second major surface 1b of the n type SiC substrate 1 by vacuum evaporation to form the second ohmic electrode 5. In the meantime, the first ohmic electrode 4 is formed on the partial surface area of the p type SiC layer 3 of each diode element, using a metal mask, so that, when the laminated substrate is severed into individual diode elements along the broken lines in the figure, the first ohmic electrode 4 having an area of $7 \times 10^{-5}$ to $7 \times 10^{-4}$ cm$^2$ is disposed at the center of each diode element. The second ohmic electrode 5 is formed on at least a portion off the center of the surface of the n type SiC substrate 1 of the each diode element and so the p type ohmic electrode 4 is broader then the n type ohmic electrode 5 as seen in FIG. 1.

The laminated substrate is then heat-treated at 900° to 1000° C. in vacuum, in an atmosphere of Ar, H$_2$, N$_2$, He or a mixture thereof. In this manner, each of the electrodes 4, 5 forms an ohmic contact with the SiC surface.

Figure 2D:
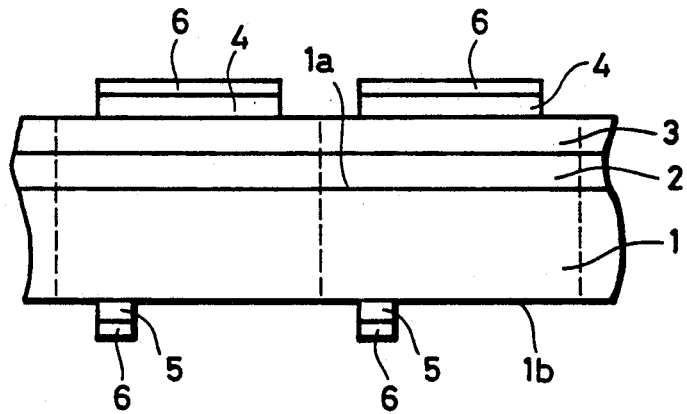

Referring to FIG. 2D, a Ti film of a thickness of 1000 Å, a Pd film of a thickness of 2000 Å and an Au film of a thickness of 5000 Å are formed in this order on each of the first ohmic electrode 4 and the second ohmic electrode 5 by vacuum evaporation to form the bonding electrodes 6.

The laminated substrate thus produced is heat-treated at 300° to 500° C. in vacuum or in an atmosphere of Ar, H$_2$, N$_2$, He or a mixture thereof.

Figure 2E:
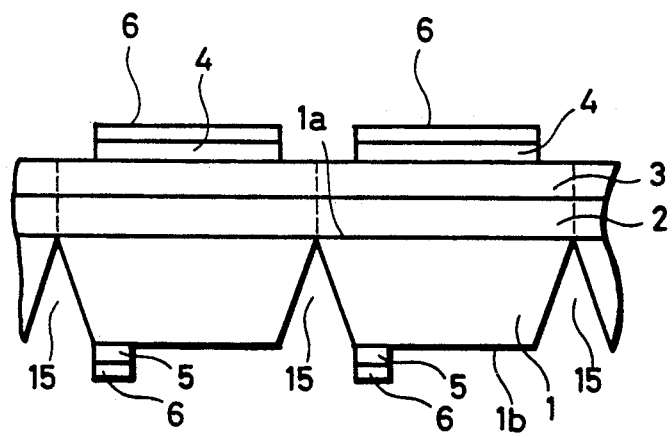

Referring to FIG. 2E, grooves 15 for separation of diode elements is formed to a depth of 20 to 70 μm by dicing on the second major surface side of the n type SiC substrate 1 of the laminated block. The grooves 15 are formed in the shape of a wedge so that the diode elements to be separated from each other has substantially a trapezoidal form in a cross section perpendicular to the first major surface 1a. In each diode element to be separated, the p type SiC layer side is wider than the second major surface side of the substrate 1.

Figure 2F:
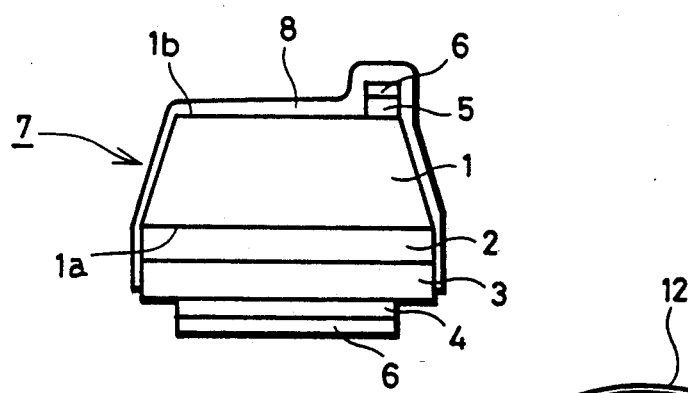

Referring to FIG. 2F, the laminated block provided with a plurality of the grooves 15 are severed mechanically into respective light emitting diode element 7. Each of the light emitting diode elements 7 is washed with an organic solvent and a protective film 8 of A$_{12}$O$_3$ or SiO$_2$ is deposited on the second major surface 1b and the lateral sides of the light emitting diode element 7 by Ar sputtering.

Figure 2G:
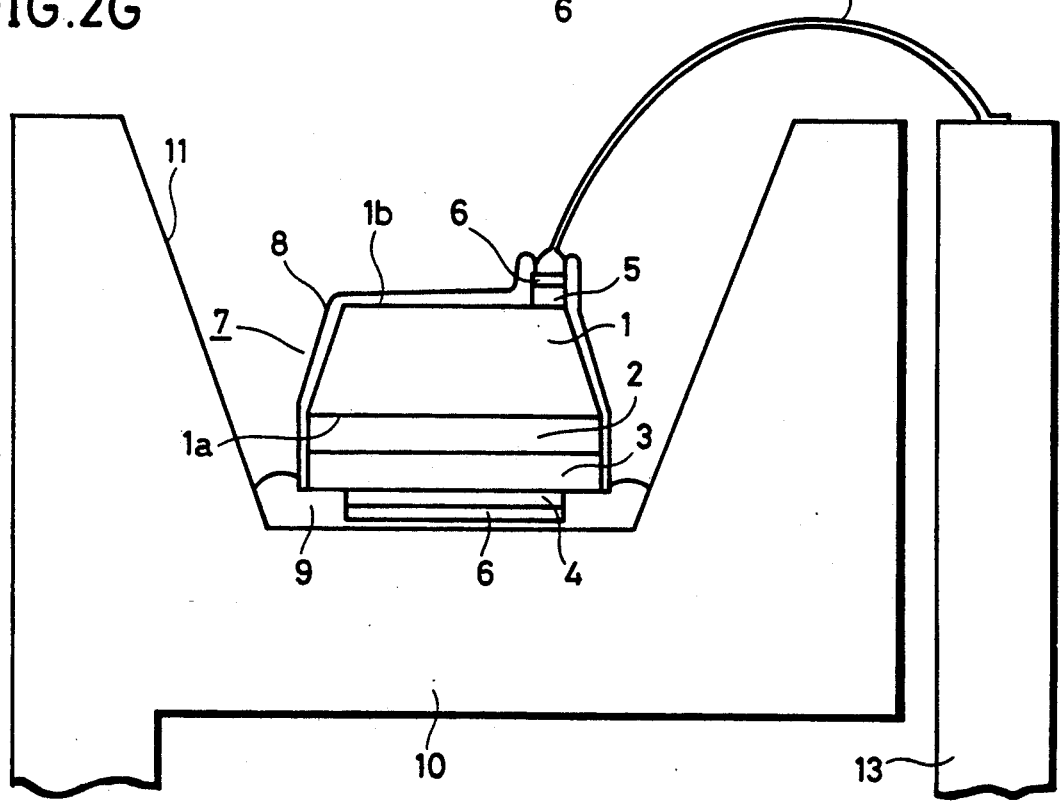

Finally, referring to FIG. 2G, the p type SiC layer side of the light emitting diode element 7 is placed on the first stem 10 via the silver paste 9 and heat-treated at a temperature in the range of 130° to 170° C. The bonding electrode 6 on the second major surface side of the n type SiC substrate 1 is connected to the second stem 13 by a gold wire 12. Although the bonding electrode 6 on the second major surface side of the n type SiC substrate 1 is covered with the protective film 8, if the film 8 has a thickness of not more than 2000 Å, the gold wire 12 pierces the protective film 8 at the time of wire bonding so as to be connected with the bonding electrode 6. If the protective film 8 is so thick that it cannot be pierced by the wire, it is only necessary to remove a portion of the protective film 8 on the bonding electrode 6 mechanically prior to wire bonding. Finally, the light emitting diode element 7 and portions of the first and second stems 10 and 13 are covered by the transparent resin molding 14 (not shown in FIG. 2G) to complete the SiC light emitting diode device shown in FIG. 1.

In accordance with the above described process, and using the n type SiC substrate 1 having the n type carrier concentration of $8 \times 10^{17}$ cm$^{-3}$, each layer was formed under the conditions shown in table II, with the first major surface 1a of the substrate inclined by 5° toward a $<11\bar{2}0>$ direction from the $(000\bar{1})$ plane.

TABLE II

| film thickness | n type SiC layer 7 μm | p type SiC layer 7 μm |
|---|---|---|
| carrier concentration | $5 \times 10^{17}$ cm$^{-3}$ (N: $7 \times 10^{17}$ cm$^{-3}$ Al: $2 \times 10^{17}$ cm$^{-3}$) | $2 \times 10^{17}$ cm$^{-3}$ |
| growth temperature | 1700° C. | 1700° C. |

The surface area of the first ohmic electrode 4 was $4 \times 10^{-4}$ cm$^2$.

The wavelength of the light emitted by the SiC light emitting diode device produced as described above was 482 nm, while the intensity of the light was as high as 10 to 12 mcd for a driving current of 20 mA.

According to the present invention, by using the first major surface 1a of the substrate 1 inclined from a $(000\bar{1})$ or (0001) plane, the n type SiC layer having improved crystal integrity can be formed, so that it becomes possible to add more impurities without impairing the crystal integrity. As a result, the number of donor-acceptor pairs, acting as centers of light emission, is increased and thus the intensity of the emitted light is increased.

The light emitting diode element has substantially a trapezoidal form in a vertical section, with the surface of the p type SiC layer as the bottom side and the surface of the n type SiC substrate as the upper surface. The first and second ohmic electrodes are formed on at least a portion of the n type SiC substrate and on at least a portion of the p type SiC layer, respectively, and the diode element is secured to the stem on the side of the p type SiC layer, so that the light can be taken out efficiently to outside.

In addition, according to the present invention, the wavelength shift of the emitted light caused by aging under electric current can be reduced. As a result, the intensity of the emitted light may be increased to 10 to 12 mcd for the driving current 20 mA while the emitted light is high quality blue not containing green.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A light emitting diode device comprising:
 a light emitting diode element and a stem supporting said diode element, said diode element including
 an n-type silicon carbide substrate having a crystallographic plane on which appears an atomic plane selected from the group consisting of a silicon atomic plane and a carbon atomic plane, the n-type silicon carbide substrate having first and second major surfaces opposite to each other, at least said first major surface being inclined from the crystallographic plane, an n-type silicon carbide layer grown on said first major surface, a p-type silicon carbide layer grown on said n-type silicon carbide layer, said p-type silicon carbide layer having a side which faces said stem, a first ohmic electrode formed on at least a portion of said p-type silicon carbide layer, and a second ohmic electrode formed on at least a portion of said second major surface, said diode element having a substantially trapezoidal form in a cross section orthogonal to said first major surface, with said side of said p-type silicon carbide layer being broader than said second major surface, said stem and said side of said p-type silicon carbide layer being fixed to each other, said n-type silicon carbide substrate and said first and second ohmic electrodes cooperating with each other to enable a greater amount of light to emerge out of said diode element via said second major surface free of obstruction caused by said second ohmic electrode than emerges out of said diode element via said p-type silicon carbide layer free of obstruction caused by said first ohmic electrode, said n-type silicon carbide substrate being thicker than said p-type silicon carbide layer.

2. The device according to claim 1, wherein said first major surface is inclined from the crystallographic plane on which the carbon atomic plane appears.

3. The device according to claim 1, wherein said n-type substrate has a specific resistance of not more than 1.0 Ωcm and said second ohmic electrode is located in the vicinity of the edge of the said second major surface.

4. The device according to claim 1, wherein said stem has a reflective portion.

5. The device according to claim 1, wherein said first major surface is inclined of at least 3° from said carbon atomic plane.

6. The device according to claim 1, wherein said second ohmic electrode is narrower than said first ohmic electrode so as to block less light than does said first ohmic electrode.

7. The device according to claim 1, wherein said n-type silicon carbide substrate has a light transmissibility which is greater than that of said p-type silicon carbide layer.

8. The device according to claim 1, wherein said first ohmic electrode is closer to said stem than is said second ohmic electrode.

9. A light emitting diode device comprising:

a light emitting diode element and a stem supporting said diode element, said diode element including an n-type silicon carbide substrate having a crystallographic plane on which appears an atomic plane selected from the group consisting of a silicon atomic plane and a carbon atomic plane, the n-type silicon carbide substrate having first and second major surfaces opposite to each other, at least said first major surface being inclined at an angle of at least 3° from the crystallographic plane, an n-type silicon carbide layer grown on said first major surface, a p-type silicon carbide layer grown on said n-type silicon carbide layer, said p-type silicon carbide layer having a side which faces said stem, a first ohmic electrode formed on a portion of said p-type silicon carbide layer, and a second ohmic electrode formed on a portion of said second major surface, said n-type silicon carbide substrate and said first and second ohmic electrodes cooperating with each other to enable a greater amount of light to emerge out of said diode element via said second major surface free of obstruction caused by said second ohmic electrode than emerges out of said diode element via said p-type silicon carbide layer free of obstruction caused by said first ohmic electrode, said stem and said side of said p-type silicon carbide layer being fixed to each other, said n-type silicon carbide substrate being thicker than said p-type silicon carbide layer.

10. The device according to claim 9, wherein said second ohmic electrode is narrower than said first ohmic electrode so as to block less light than does said first ohmic electrode.

11. The device according to claim 9, wherein said n-type silicon carbide substrate has a light transmissibility which is greater than that of said p-type silicon carbide layer.

12. The device according to claim 9, wherein said p-type silicon carbide layer is broader than is said second major surface.

13. The device according to claim 9, wherein said first major surface is inclined toward a $<1130>$ direction from said crystallographic plane.

14. The device according to claim 9, wherein said first major surface is inclined toward a $<10\bar{1}0>$ direction from said crystallographic plane.

15. A light emitting diode device comprising:

a light emitting diode element and a stem supporting said diode element, said diode element including an n-type silicon carbide substrate having first and second major surface opposite to each other;

an n-type silicon carbide layer grown on said first major surface, a p-type silicon carbide layer grown on said n-type silicon carbide layer, said p-type silicon carbide layer having a side which faces said stem, a first ohmic electrode formed on at least a portion of said p-type silicon carbide layer, and a second ohmic electrode formed on at least a portion of said second major surface, said n-type silicon carbide substrate and said first and second ohmic electrodes cooperating with each other to enable a greater amount of light to emerge out of said diode element via said second major surface free of obstruction caused by said second ohmic electrode than emerges out of said diode element via said p-type silicon carbide layer free of obstruction caused by said first ohmic electrode, said stem and said side of said p-type silicon carbide layer being fixed to each other, said n-type silicon carbide substrate being thicker than said p-type silicon carbide layer.

16. The device according to claim 15, wherein said p-type silicon carbide layer is broader than is said second major surface.

17. The device according to claim 15, wherein said second ohmic electrode is narrower than said first ohmic electrode so as to block less light than does said first ohmic electrode.

18. The device according to claim 15, wherein said n-type silicon carbide substrate has a light transmissibility which is greater than that of said p-type silicon carbide layer.

19. A light emitting diode device comprising:
a light emitting diode element and a stem supporting said diode element, said diode element including
an n-type silicon carbide substrate having a crystallographic plane on which appears an atomic plane selected from the group consisting of a silicon atomic plane and a carbon atomic plane, said n-type silicon carbide substrate having first and second major surfaces opposite each other, at least said first major surface being inclined from said crystallographic plane,
an n-type silicon carbide layer grown on said first major surface,
a p-type silicon carbide layer grown on said n-type silicon carbide layer, said p-type silicon carbide layer having a side which faces said stem,
a first ohmic electrode formed on at least a portion of said p-type silicon carbide layer, and
a second ohmic electrode having a smaller areal size than said first ohmic electrode and formed on said second major surface,
said diode element having an approximately trapezoidal form in a cross section orthogonal to said first major surface, said side of said p-type silicon carbide layer being broader than said second major surface, said stem and said side of said p-type silicon carbide layer being fixed to each other, whereby a greater part of light generated in said n-type silicon carbide layer is emitted from said diode element through said n-type silicon carbide substrate than through said p-type silicon carbide layer, said n-type silicon carbide substrate being thicker than said p-type silicon carbide layer.

20. The device according to claim 19, wherein at least said first major surface is inclined at least 3° from the crystallographic plane.

21. The device according to claim 19, wherein at least said first major surface is inclined from the crystallographic plane on which the carbon atomic plane appears.

22. A light emitting diode device comprising:
a light emitting diode element and a stem supporting said diode element, said diode element including
an n-type silicon carbide substrate having first and second major surfaces opposite to each other, at least said first major surface being inclined from a {0001} crystallographic plane,
an n-type silicon carbide layer grown on said first major surface,
a p-type silicon carbide layer grown on said n-type silicon carbide layer, said p-type silicon carbide layer having a side which faces said stem,
a first ohmic electrode formed on at least a portion of said p-type silicon carbide layer, and
a second ohmic electrode formed on at least a portion of said second major surface,
said diode element having a substantially trapezoidal form in a cross section orthogonal to said first major surface, said side of said p-type silicon carbide layer being broader than said second major surface, said stem and said side of said p-type silicon carbide layer being fixed to each other, said n-type silicon carbide substrate and said first and second ohmic electrodes cooperating with each other to enable a greater amount of light to emerge out of said diode element via said second major surface free of obstruction caused by said second ohmic electrode than emerges out of said diode element via said p-type silicon carbide layer free of obstruction caused by said first ohmic electrode, said n-type silicon carbide substrate being thicker than said p-type silicon carbide layer.

23. A light emitting diode element comprising:
a light emitting diode element and a stem supporting said diode element, said diode element including
an n-type silicon carbide substrate having first and second major surfaces opposite to each other, at least said first major surface being inclined at an angle of at least 3° from a {0001} crystallographic plane,
an n-type silicon carbide layer grown on said first major surface,
a p-type silicon carbide layer grown on said n-type silicon carbide layer, said p-type silicon carbide layer having a side which faces said stem,
a first ohmic electrode formed on a portion of said p-type silicon carbide layer, and
a second ohmic electrode formed on a portion of said second major surface, said n-type silicon carbide substrate and said first and second ohmic electrodes cooperating with each other to enable a greater amount of light to emerge out of said diode element via said second major surface free of obstruction caused by said second ohmic electrode than emerges out of said diode element via said p-type silicon carbide layer free of obstruction caused by said first ohmic electrode, said stem and said side of said p-type silicon carbide layer being fixed to each other, said n-type silicon carbide substrate being thicker than said p-type silicon carbide layer.

24. A light emitting diode device comprising:
a light emitting diode element and a stem supporting said diode element, said diode element including
an n-type silicon carbide substrate having first and second major surfaces opposite each other, at least said first major surface being inclined from a crystallographic plane of {0001} plane of the substrate,
an n-type silicon carbide layer grown on said first major surface,
a p-type silicon carbide layer grown on said n-type silicon carbide layer, said p-type silicon carbide layer having side which faces said stem,
a first ohmic electrode formed on at least a portion of said p-type silicon carbide layer, and
a second ohmic electrode having a smaller areal size than said first ohmic electrode and formed on said second major surface,
said diode element having an approximately trapezoidal form in a cross section orthogonal to said first major surface, with said side of said p-type silicon carbide layer being broader than said second major surface, said stem and said side of said p-type silicon carbide layer being fixed to each other, whereby a greater part of light generated in said n-type silicon carbide layer is emitted from said diode element through said n-type silicon carbide substrate than through said p-type silicon carbide layer, said n-type silicon carbide substrate being thicker than said p-type silicon carbide layer.

25. A light emitting diode device comprising:
a light emitting diode element and a stem supporting said diode element, said diode element including:
an n-type SiC substrate having a crystallographic plane on which appears an atomic plane selected from the group consisting of a silicon atomic plane and a carbon atomic plane, said n-type SiC substrate having first and second major surfaces opposite to each other, at least said first major surface being inclined toward a direction of $<10\bar{1}0>$ from said crystallographic plane, an n-type SiC layer formed on said first major surface, a p-type SiC layer formed on said n-type SiC layer, said p-type SiC layer having a side which faces said stem, a first ohmic electrode formed on at least a portion of said p-type SiC layer, a second ohmic electrode formed on at least a portion of said second major surface, and said diode element having a substantially trapezoidal form in a cross section orthogonal to said first major surface, with said side of said p-type SiC layer being broader than said second major surface, said stem and said side of said p-type SiC layer being fixed to each other, said n-type SiC substrate and said first and second ohmic electrodes cooperating with each other to enable a greater amount of light to emerge out of said diode element via said second major surface free of obstruction caused by said second ohmic electrode than emerges out of said diode element via said p-type silicon carbide layer free of obstruction caused by said first ohmic electrode, said n-type silicon carbide substrate being thicker than said p-type silicon carbide layer.

26. The device according to claim 25, wherein at least said first major surface is inclined at least 3° from the crystallographic plane.

27. The device according to claim 25, wherein said first ohmic electrode is larger in area than said second ohmic electrode.

28. A light emitting diode device comprising:
a light emitting diode element and a stem supporting said diode element, said diode element including:
an n-type SiC substrate having first and second major surfaces opposite to each other, at least said first major surface being inclined toward a direction of $<10\bar{1}0>$ from a {0001} crystallographic plane,
an n-type SiC layer formed on said first major surface,
a p-type SiC layer formed on said n-type SiC layer, said p-type SiC layer having a side which faces said stem,
a first ohmic electrode formed on at least a portion of said p-type SiC layer,
a second ohmic electrode formed on at least a portion of said second major surface, and
said diode element having a substantially trapezoidal form in a cross section orthogonal to said first major surface, said side of said p-type SiC layer being broader than said second major surface, said stem and said side of said p-type SiC layer being fixed to each other, said n-type SiC substrate and said first and second ohmic electrodes cooperating with each other to enable a greater amount of light to emerge out of said diode element via said second major surface free of obstruction caused by said second ohmic electrode than emerges out of said diode element via said p-type silicon carbide layer free of obstruction caused by said first ohmic electrode, said n-type silicon carbide substrate being thicker than said p-type silicon carbide layer.

29. A light emitting diode device comprising:
a light emitting diode element and a stem supporting said diode element, said diode element including:
an n-type SiC substrate having a crystallographic plane on which appears an atomic plane selected from the group consisting of a silicon atomic plane and a carbon atomic plane, said n-type SiC substrate having first and second major surfaces opposite to each other, at least said first major surface being inclined toward a direction of $<11\bar{2}0>$ from said crystallographic plane,
an n-type SiC layer formed on said first major surface,
a p-type SiC layer formed on said n-type SiC layer, said p-type SiC layer having a side which faces said stem,
a first ohmic electrode formed on at least a portion of said p-type SiC layer,
a second ohmic electrode formed on at least a portion of said second major surface, and
said diode element having a substantially trapezoidal form in a cross section orthogonal to said first major surface, said side of said p-type SiC layer being broader than said second major surface, said stem and said side of said p-type SiC layer being fixed to each other, said n-type SiC substrate and said first and second ohmic electrodes cooperating with each other to enable a greater amount of light to emerge out of said diode element via said second major surface free of obstruction caused by said second ohmic electrode than emerges out of said diode element via said p-type silicon carbide layer free of obstruction caused by said first ohmic electrode, said n-type silicon carbide substrate being thicker than said p-type silicon carbide layer.

30. The device according to claim 29, wherein at least said first major surface is inclined at least 3° from the crystallographic plane.

31. The device according to claim 29, wherein said first ohmic electrode is larger in area than said second ohmic electrode.

32. A light emitting diode device comprising:
a light emitting diode element and a stem supporting said diode element, said diode element including:
an n-type SiC substrate having first and second major surfaces opposite to each other, at least said first major surface being inclined toward a direction of $<11\bar{2}0>$ from a {0001} crystallographic plane,
an n-type SiC layer formed on said first major surface,
a p-type SiC layer formed on said n-type SiC layer, said p-type SiC layer having a side which faces said stem,
a first ohmic electrode formed on at least a portion of said p-type SiC layer,
a second ohmic electrode formed on at least a portion of said second major surface, and
said diode element having a substantially trapezoidal form in a cross section orthogonal to said first major surface, said side of said p-type SiC layer being broader than said second major surface, said stem and said side of said p-type SiC layer being fixed to each other, said n-type SiC substrate and said first and second ohmic electrodes cooperating with each other to enable a greater amount of light to emerge out of said diode element via said second major surface free of obstruction caused by said second ohmic electrode than emerges out of said diode element via said p-type silicon carbide layer free of obstruction caused by said first ohmic electrode, said n-type silicon carbide substrate being thicker than said p-type silicon carbide layer.

33. A light emitting diode device, comprising:
a silicon carbide substrate of a first conductivity type, the substrate having first and second major surfaces opposite each other;

a first silicon carbide layer of the first conductivity type, the layer being grown on the first major surface;

a second silicon carbide layer of a second conductivity type which differs from that of the first conductivity type, the second silicon carbide layer being grown on the first silicon carbide layer, the substrate being thicker than the second silicon carbide layer;

a first ohmic electrode formed on at least a portion of the second silicon carbide layer;

a second ohmic electrode formed on at least a portion of said second major surface; and supporting means for supporting said silicon carbide substrate, said first and second carbide layers, and said first and second ohmic electrodes, said supporting means including a stem, said first and second silicon carbide layers forming a junction therebetween which is closer to said stem than is said silicon carbide substrate, the silicon carbide substrate being thicker than the second silicon carbide layer, said first silicon carbide substrate and said first and second ohmic electrodes cooperating with each other to enable a greater amount of light to emerge out of said diode element via said second major surface free of obstruction caused by said second ohmic electrode than emerges out of said diode element via said first silicon carbide layer free of obstruction caused by said first ohmic electrode.

34. A device as in claim 33, wherein the second silicon carbide layer is broader than the second major surface.

* * * * *

UNITED STATES PATENT AND TRADEMARK OFFICE
CERTIFICATE OF CORRECTION

PATENT NO. : 5,187,547
DATED : February 16, 1993
INVENTOR(S) : Niina et al.

It is certified that error appears in the above-identified patent and that said Letters Patent is hereby corrected as shown below:

On the cover page change the second listed foreign application number set forth under the heading "[30] Foreign Application Priority Data" by changing "63-15711" to read instead as --1-15711--.

Signed and Sealed this

Twenty-second Day of February, 1994

Attest:

BRUCE LEHMAN

*Attesting Officer*   *Commissioner of Patents and Trademarks*